(12) United States Patent
Kruspe et al.

(10) Patent No.: US 6,686,737 B2
(45) Date of Patent: Feb. 3, 2004

(54) AMPLITUDE AND/OR PHASE MODULATED NMR PULSE SEQUENCES

(75) Inventors: Thomas Kruspe, Wienhausen (DE); Martin Blanz, Celle (DE); Peter Rottengatter, Isernhagen (DE)

(73) Assignee: Baker Hughes Incorporated, Houston, TX (US)

( * ) Notice: Subject to any disclaimer, the term of this patent is extended or adjusted under 35 U.S.C. 154(b) by 0 days.

(21) Appl. No.: 09/976,492

(22) Filed: Oct. 12, 2001

(65) Prior Publication Data

US 2003/0071617 A1 Apr. 17, 2003

(51) Int. Cl.[7] .................................................. G01V 3/00
(52) U.S. Cl. ....................................................... 324/303
(58) Field of Search ......................................... 324/303

(56) References Cited

U.S. PATENT DOCUMENTS

| | | | | |
|---|---|---|---|---|
| 4,665,366 A | | 5/1987 | Macovski ................... 324/309 |
| 5,250,900 A | | 10/1993 | Ehnholm ..................... 324/309 |
| 5,796,252 A | * | 8/1998 | Kleinberg et al. ........... 324/303 |
| 5,814,987 A | | 9/1998 | Smith et al. ................ 324/300 |
| 5,814,989 A | | 9/1998 | Smith et al. ................ 324/300 |
| 6,111,409 A | * | 8/2000 | Edwards et al. ............ 324/303 |
| 6,247,542 B1 | | 6/2001 | Kruspe et al. ................ 175/40 |
| 6,366,086 B1 | * | 4/2002 | Sen ............................. 324/303 |
| 6,369,567 B1 | * | 4/2002 | Song et al. .................. 324/303 |
| 6,437,564 B1 | * | 8/2002 | Itskovich et al. ........... 324/303 |
| 6,492,809 B1 | * | 12/2002 | Speier et al. ................ 324/303 |
| 6,498,484 B1 | * | 12/2002 | Sun et al. .................... 324/303 |
| 6,518,757 B1 | * | 2/2003 | Speier ........................ 324/303 |

OTHER PUBLICATIONS

Shenheng Guan; *Generation of optimal excitation pulses for two energy level systems using an inverse Fourier transform method*, J. Chem. Phys. vol. 96, No. 11 Jun. 1, 1992 pp. 7959–7964, 3 Figs.

* cited by examiner

*Primary Examiner*—Diego Gutierrez
*Assistant Examiner*—Dixomara Vargas
(74) *Attorney, Agent, or Firm*—Madan, Mossman & Sriram, P.C.

(57) ABSTRACT

The excitation and/or refocusing pulses used in a CPMG sequence have a nonlinear phase and an envelope with no zero crossings and a corresponding frequency spectrum with sidelobes suppressed. As a result of this, peak power requirements are reduced. Pulse shaping is used for reducing the peak power requirements of a NMR logging tool.

17 Claims, 6 Drawing Sheets

AMPLITUDE AND/OR PHASE MODULATED NMR PULSE SEQUENCES

BACKGROUND OF THE INVENTION

1. Field of the Invention

The invention is in the area of determination of Nuclear Magnetic Resonance properties of materials. Specifically, the invention is related to modifying the temporal shape of excitation pulses used in measurement procedures in downhole wellbore logging techniques.

2. Description of the Related Art

NMR methods are based on the well-understood properties of nuclear spin moments when they are subjected to a static external magnetic field along with an oscillating external magnetic field. It is known that in the absence of a magnetic field, spins tend to orient themselves in random directions. In the presence of only a static magnetic field, these individual spins tend to align themselves along the direction of the applied field. This alignment gives rise to an overall magnetization, referred to as the bulk magnetization vector. When the external field is removed, the spins resume their random orientation, and the bulk magnetization vector falls to zero.

Typical NMR methods determine properties of the material by observing how applied RF magnetic fields affect the spin vectors. In current methods, spins are first aligned via the application of a static external magnetic field, causing a magnetization. In well logging, this magnetic field is typically provided by a permanent magnet. Once equilibrium magnetization has been reached, a single RF magnetic pulse is applied perpendicular to the static field that aligns the spins generally in the plane perpendicular to this applied field and generally perpendicular to both the static and RF fields. This pulse tips the magnetization into a direction perpendicular to the static magnetic field and is referred to as a 90⌒ pulse. After the application and removal of a 90⌒ RF magnetic pulse, the spins exhibit a precession around the direction of the static field with a frequency known as the Larmor frequency. The Larmor frequency is given by $\omega_0 = \gamma B_0$, where $\gamma$ is the gyromagnetic ratio and $B_0$ is the strength of the applied constant field. This precessing magnetization induces a signal in a surrounding coil. This is the NMR signal.

After the application and removal of a 90⌒ RF magnetic pulse, the spins tend to re-align with the static magnetic field. The re-orientation along this direction is characterized by a time constant known as the spin-lattice relaxation time, $T_1$.

Typically, the effective static magnetic field is inhomogeneous throughout the formation. As a result, each spin vector tends to precess at slightly different rates, according to its local magnetic field. The phase between the vectors, originally nearly zero at the moment the RF magnetic field is removed, diffuses as some vectors spin faster and some spin slower. The diffusion of the phase leads to a reduction of the component of the bulk magnetization in the plane perpendicular to the applied field. This process is known as dephasing. This component reduction is known as the free induction decay (FID) and is characterized by its time constant, $T_2^*$. The dephasing can be recovered partly as long as the underlying cause, the local spatial variation of the magnetic field, is static. Recovering the phase is done by using one or more refocusing pulses and leads to the formation of one or more spin echoes. The decay of these echoes is characterized by its time constant $T_2$.

To observe the values for these time constants and in particular of $T_2$, the practitioner often applies a sequence of RF magnetic pulses. A sequence of pulses that is used widely in current methods is known as the Carr-Purcell-Meiboom-Gill (CPMG) sequence. In this sequence, the first pulse is a 90° pulse, which aligns the spins generally perpendicular to the applied static magnetic field. Subsequent pulses have twice the duration of the first pulse, and as a result are able to flip each spin vector a full 180° from the direction it had immediately prior to the application of the pulse. A 180° pulse is typically applied during a dephasing stage of the spin echoes. After the pulse is removed, the order of the spins is reversed, with the slowly precessing spins spatially in front of the faster precessing spins. The phase between the spin vectors, which was previously diffusing, now is converging back to zero. At convergence, the spin vectors are generally aligned in a common direction again, and the bulk magnetization vector reaches a maximum value, creating a magnetic pulse known as a spin echo. The spin echo induces a voltage in a receiver coil, which is measured through the electronic assembly attached to the coil.

The CPMG sequence can be expressed as $$TW-90-(t-180-t-echo)_n \qquad (1)$$

where TW is a wait time, 90 is an excitation pulse having a tipping angle of 90°, and 180 is a 180° refocusing pulse. This gives a sequence of n echo signals.

The shape of the CPMG pulse can have enormous impact on the amount of power consumption and efficiency of the well-logging process. Current methods commonly use a rectangular pulse to flip the orientations of the nuclear spins. Due to the Fourier series relation between time and frequency, the shape of this pulse in the frequency domain is that of a sinc function $(\sin\omega t/\omega t)$. For several reasons, the rectangular pulse therefore is not an ideal excitation profile. Firstly, the corresponding function in the frequency domain contains many side lobes of alternating sign. Thus, substantial power is consumed by frequencies of the side lobes rather than by the desired central excitation frequency. Also, pulse power increases with the square of the required excitation bandwidth. This is because the pulse amplitude must be inversely proportional to the pulse temporal length of the RF pulse if the spin tip angle is to stay constant, say 90°. Due to a high level of coherency at time zero and destructive interference at later times, the pulse is of short duration and high power.

Co-pending U.S. patent application Ser. No. 09/606,998 of Beard et al having the same assignee as the present application teaches the use of pulse shaping in a gradient NMR logging tool for reducing interference between frequencies used in a multifrequency NMR acquisition method. This is desirable in a multifrequency logging instrument to avoid interference between the sidelobes of pulses at one acquisition frequency with the center frequency of an adjacent frequency band. The pulse shaping described by Beard deals only with the shape of the excitation and refocusing pulses.

Pulse shaping has been discussed in Guan for the problem of NMR solvent suppression. In NMR solvent suppression it is desirable to suppress the solvent signal when studying a small concentration of a substance of interest in a solvent. To suppress the solvent and only see the wanted NMR signal, Guan uses an RF pulse which has a non-contiguous frequency spectrum, i.e. a spectrum with a notch at the solvent resonance frequency. U.S. Pat. No. 5,814,987 to Smith et al teaches the use of pulse shaping for Nuclear Quadrupole Resonance (NQR) testing.

SUMMARY OF THE INVENTION

In a preferred embodiment of the invention, a static magnetic field is produced in a region of interest to align the nuclear spins and a pulsed radio frequency (RF) magnetic field is used to produce spin echo signals indicative of the relaxation properties of the region. Phase modulation of the excitation and/or refocusing pulses is used to reduce the peak and time averaged power requirements over prior art methods that use only amplitude modulation of the RF carrier signal. In an alternate embodiment of the invention, both amplitude and phase modulation are used. The phase may be symmetric or antisymmetric with respect to frequency. In a preferred embodiment of the invention, the phase has a quadratic dependence on frequency.

When used in conjunction with a gradient tool operated at multiple frequencies, the pulse shaping may be used to reduce interference between spin echo signals arising from adjacent volumes of the formation.

DESCRIPTION OF PREFFERED EMBODIMENT

An NMR well logging apparatus which is suitable for use with this invention is described, for example, in U.S. Pat. No. 6,247,542 to Kruspe et al., the contents of which are fully incorporated herein by reference. The device in Kruspe is for exemplary purposes only and the method of the present invention may be used with any NMR well logging apparatus including one conveyed on a wireline. As taught by Kruspe, the NMR sensor assembly is slidably coupled to the longitudinal member wherein the sensor assembly includes at least one sensor for obtaining measurements relating to the parameter of interest. When the sensor assembly is held in a non-rotating position, for instance, for obtaining the measurements, the longitudinal member is free to rotate and continue drilling the borehole. The sensor assembly is slidably coupled to the longitudinal member using, for example, at least one guide sleeve slidably coupled to the longitudinal member. The sensor assembly further includes, for example, at least one transmitter. The sensor assembly of the present invention can include any of a variety of sensors and/or transmitters for determining a plurality of parameters of interest including, for example, nuclear magnetic resonance measurements. The device of Kruspe makes it possible, for example, to obtain NMR measurements with the NMR assembly clamped to the borehole while drilling continues.

Another aspect of the invention described herein is a method of modulating the phase and/or amplitude of magnetic rectangular pulses used in the CPMG sequence used in MWD processes. The intent of the invention is to reduce power consumption and improve efficiency of the process.

Figure 1:
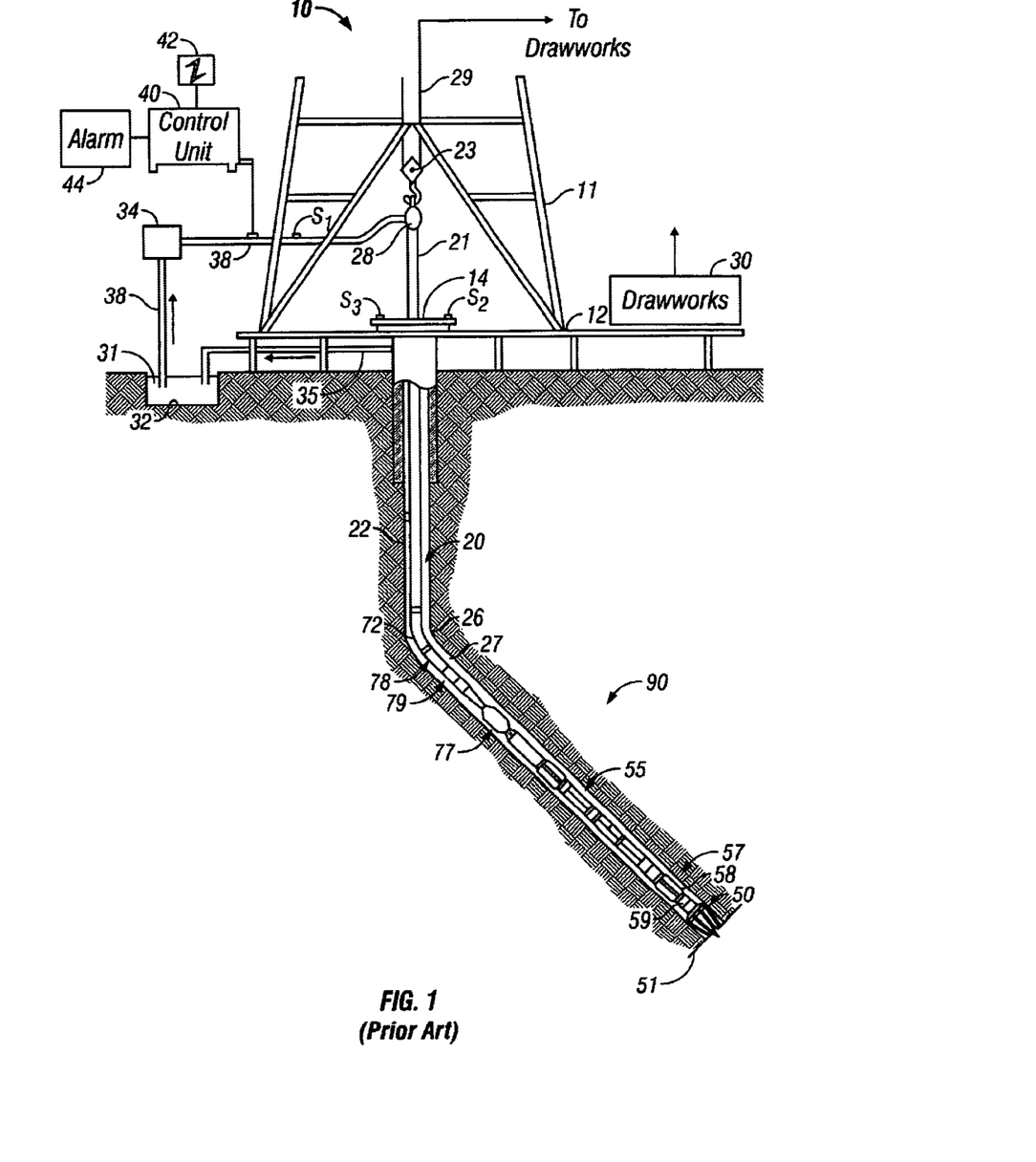
FIG. 1 (PRIOR ART) is a schematic illustration of an exemplary drilling system using the present invention.

FIG. 1 (PRIOR ART) shows a schematic diagram of a drilling system 10 with a drillstring 20 carrying a drilling assembly 90 (also referred to as the bottom hole assembly, or "BHA") conveyed in a "wellbore" or "borehole" 26 for drilling the wellbore. The drilling system 10 includes a conventional derrick 11 erected on a floor 12 which supports a rotary table 14 that is rotated by a prime mover such as an electric motor (not shown) at a desired rotational speed. The drillstring 20 includes a tubing such as a drill pipe 22 or a coiled-tubing extending downward from the surface into the borehole 26. The drillstring 20 is pushed into the wellbore 26 when a drill pipe 22 is used as the tubing. For coiled-tubing applications, a tubing injector (not shown), however, is used to move the tubing from a source thereof, such as a reel (not shown), to the wellbore 26. The drill bit 50 attached to the end of the drillstring breaks up the geological formations when it is rotated to drill the borehole 26. If a drill pipe 22 is used, the drillstring 20 is coupled to a drawworks 30 via a Kelly joint 21, swivel 28, and line 29 through a pulley 23. During drilling operations, the drawworks 30 is operated to control the weight on bit, which is an important parameter that affects the rate of penetration. The operation of the drawworks is well known in the art and is thus not described in detail herein.

During drilling operations, a suitable drilling fluid 31 from a mud pit (source) 32 is circulated under pressure through a channel in the drillstring 20 by a mud pump 34. The drilling fluid passes from the mud pump 34 into the drillstring 20 via a fluid line 38 and Kelly joint 21. The drilling fluid 31 is discharged at the borehole bottom 51 through an opening in the drill bit 50. The drilling fluid 31 circulates uphole through the annular space 27 between the drillstring 20 and the borehole 26 and returns to the mud pit 32 via a return line 35. The drilling fluid acts to lubricate the drill bit 50 and to carry borehole cutting or chips away from the drill bit 50. A sensor $S_1$ preferably placed in the line 38 provides information about the fluid flow rate. A surface torque sensor $S_2$ and a sensor $S_3$ associated with the drillstring 20 respectively provide information about the torque and rotational speed of the drillstring. Additionally, a sensor (not shown) associated with line 29 is used to provide the hook load of the drillstring 20.

In one embodiment of the invention, the drill bit 50 is rotated by only rotating the drill pipe 22. In another embodiment of the invention, a downhole motor 55 (mud motor) is disposed in the drilling assembly 90 to rotate the drill bit 50 and the drill pipe 22 is rotated usually to supplement the rotational power, if required, and to effect changes in the drilling direction.

In the preferred embodiment of FIG. 1, the mud motor 55 is coupled to the drill bit 50 via a drive shaft (not shown) disposed in a bearing assembly 57. The mud motor rotates the drill bit 50 when the drilling fluid 31 passes through the mud motor 55 under pressure. The bearing assembly 57 supports the radial and axial forces of the drill bit. A stabilizer 58 coupled to bearing assembly 57 acts as a centralizer for the lowermost portion of the mud motor assembly.

In one embodiment of the invention, a drilling sensor module 59 is placed near the drill bit 50. The drilling sensor module contains sensors, circuitry and processing software and algorithms relating to the dynamic drilling parameters. Such parameters preferably include bit bounce, stick-slip of the drilling assembly, backward rotation, torque, shocks, borehole and annulus pressure, acceleration measurements and other measurements of the drill bit condition. A suitable telemetry or communications sub 72 using, for example, two-way telemetry, is also provided as illustrated in the drilling assembly 90. The drilling sensor module processes the sensor information and transmits it to the surface control unit 40 via the telemetry system 72.

The communication sub 72, a power unit 78 and an MWD tool 79 are all connected in tandem with the drillstring 20. Flex subs, for example, are used in connecting the MWD tool 79 in the drilling assembly 90. Such subs and tools form the bottom hole drilling assembly 90 between the drillstring 20 and the drill bit 50. The drilling assembly 90 makes various measurements including the pulsed nuclear magnetic resonance measurements while the borehole 26 is being drilled. The communication sub 72 obtains the signals and measurements and transfers the signals, using two-way telemetry, for example, to be processed on the surface. Alternatively, the signals can be processed using a downhole processor in the drilling assembly 90.

The surface control unit or processor 40 also receives signals from other downhole sensors and devices and signals from sensors $S_1$–$S_3$ and other sensors used in the system 10 and processes such signals according to programmed instructions provided to the surface control unit 40. The surface control unit 40 displays desired drilling parameters and other information on a display/monitor 42 utilized by an operator to control the drilling operations. The surface control unit 40 preferably includes a computer or a microprocessor-based processing system, memory for storing programs or models and data, a recorder for recording data, and other peripherals. The control unit 40 is preferably adapted to activate alarms 44 when certain unsafe or undesirable operating conditions occur.

Figure 2A:
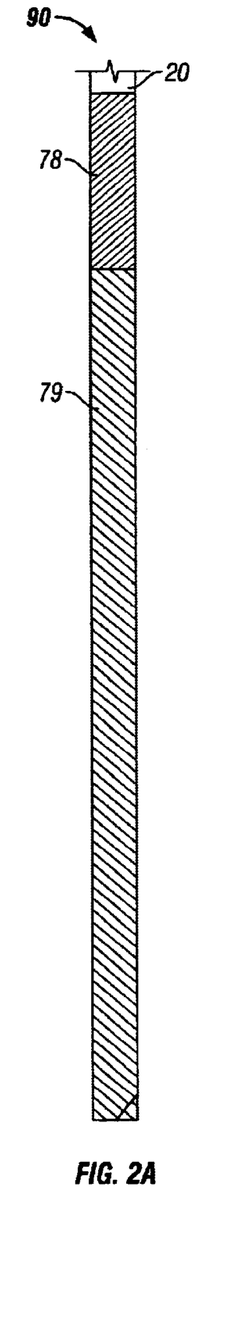
FIGS. 2A–2C (PRIOR ART) are side elevational views partially in cross section (see FIG. 2B) of a drilling assembly including a sensor assembly in accordance with the present invention.
Figure 2B:
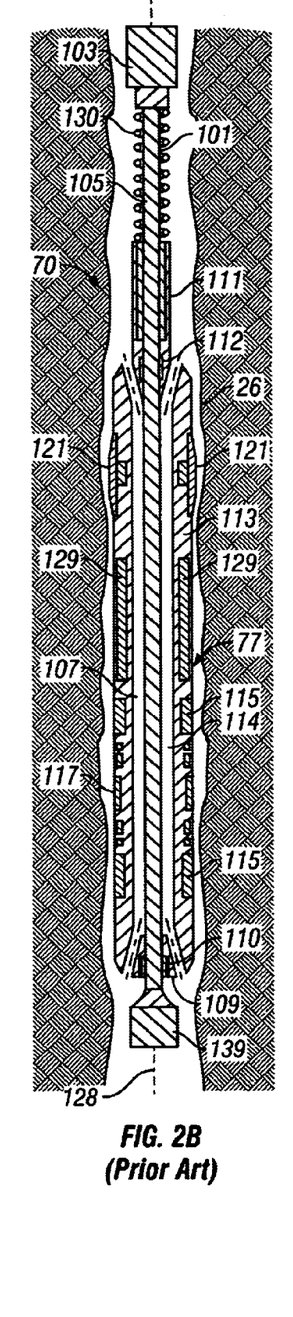
Figure 2C:
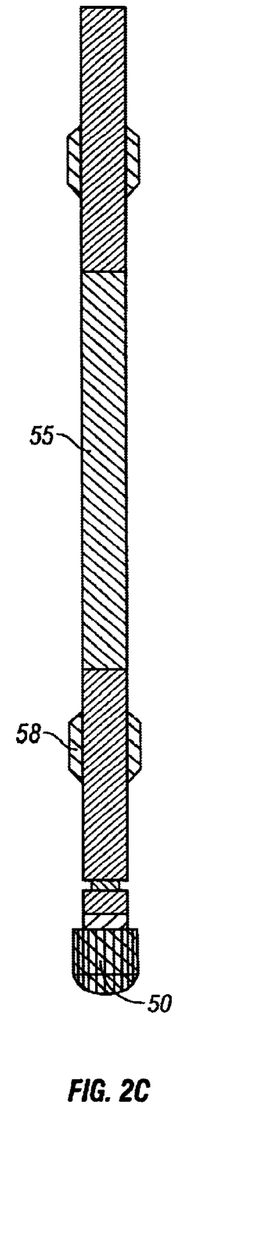

A segment 70 of drill pipe 22, illustrated in greater detail in FIGS. 2, illustrates the apparatus and method according to the present invention including a sleeve member, such as a sensor assembly, slidably coupled to a longitudinal member, such as a section of drill pipe, wherein, when the sleeve member is non-rotating, the longitudinal member is free to rotate. The sleeve member may be held in a non-rotating position through engagement with the borehole wall and a decoupling of the sleeve member and the rotating drillstring. The sleeve member including the sensor assembly illustrated in FIG. 2 describes a nuclear magnetic resonance device according to the present invention. However, the apparatus and method according to the present invention can be adapted for any MWD device or tool typically used on a rotating drillstring or for wireline logging.

Referring to FIGS. 2A–2C, the drilling assembly 90 at the end of the drillstring 20 or coiled tubing is illustrated including the segment 70 of drill pipe 22 according to the present invention. The MWD tool 79, including an associated pulsed NMR tool 77 having a sensor assembly 113, and the pulsed power unit 78 are connected in tandem in the drilling assembly 90. The MWD tool 79 may also include a sonic sensor, a density measurement tool, and a porosity measurement tool. As seen in FIG. 2B, the NMR tool 77 is rotationally symmetric about a longitudinal axis 128 of the drilling assembly 90.

The longitudinal member is, for example, a drill pipe section 101, which forms the core of the segment 70. Alternatively, the longitudinal member is a shaft in a downhole directional drilling assembly. The drill pipe section 101 is connected to the drillstring 20 by the upper tool joint 103 and the lower tool joint 139, and has a channel or flow pass 105 for the drilling mud to flow downhole. The sensor assembly 113 surrounds the drill pipe section 101 and is slidably coupled to the longitudinal member or the drill pipe section 101. The sensor assembly 113 is coupled to the drill pipe section 101 by at least one of guide sleeves 109 and 111. The guide sleeves 109 and 111 include, for instance, slip rings and bearings 110 and 112, respectively. Alternatively, a single guide sleeve (not shown) including slip rings and bearings, is used, for example, centrally located between ends of the sensor assembly 113. The guide sleeves 109 and 111 allow the sensor assembly 113 to move freely in the axial direction and to a lesser extent laterally with respect to the drill pipe section 101. The sensor assembly 113 has an outer diameter that is somewhat less than the inner diameter of the borehole 26. For illustrative purposes, FIG. 2B shows the space between the sensor assembly 113 and the borehole wall in an exaggerated manner. The NMR sensor assembly includes flow paths 107 and 114 for return flow of the drilling mud from the drilling assembly 90 below wherein the gap between the sensor assembly 113 and the borehole wall are minimized.

The magnet assembly 115, for providing the static magnetic field, and the RF coil assembly 117 are disposed in the sensor assembly 113. The RF coil assembly 117 includes, for instance, at least one transmitter for transmitting a pulsed RF field into the formation. In the configuration as illustrated in FIG. 2B, the RF field is axial and is orthogonal to the static field of the permanent magnet assembly 115 in a region of interest or examination outside the borehole for NMR signal measurements. However, the apparatus of the present invention is not limited to the illustrated sensor assembly 113. Any number of appropriate magnet arrangements and antenna or coil arrangements which provide a static magnetic field and an RF field orthogonal to the static magnetic field direction for creating the region of interest for NMR signal sensitivity can be used according to the present invention. For example, the NMR tool 77 can employ separate transmitter and receiver RF coils, located, for example, on the sensor assembly 113.

Typically, the RF coil assembly 117 is pulsed and creates a high frequency electromagnetic RF field orthogonal to the static magnetic field generated by the magnet assembly 115 and in the region of substantially uniform field strength creating the region or volume of interest for NMR signal sensitivity. The sensor assembly 113 detects the NMR signals resulting therefrom. Rock pores in the earth formations surrounding the wellbore are filled with fluid, typically water or hydrocarbon. The hydrogen nuclei in the fluid are aligned by the region of homogeneous magnetic field, generated by the magnet assembly 115. The hydrogen nuclei are then flipped away from the homogeneous magnetic field by the pulsed RF field produced by RF coil assembly 117. At the termination of the pulsed RF field from RF coil assembly 117, the hydrogen nuclei revolve or precess at high frequency around the homogeneous magnetic field inducing an NMR signal in the RF coil assembly 117 until the hydrogen nuclei relax to the original direction along the homogeneous magnetic field. The induced NMR signals are processed downhole or sent to the surface for processing.

Those versed in the art would recognize that, depending upon the configuration of the permanent magnet assembly 115, the region of examination could have one of a number of configurations. In one embodiment, the region of examination could be substantially toroidal shaped with the axis of the toroid along the longitudinal axis of the tool. In other configurations, the region of examination could be localized on opposite sides of the borehole or even on just one side of the borehole. It will also be clearly apparent to those skilled in the art that the static magnetic field area can also be obtained if the magnet assembly 115 includes dc-energized electromagnets, or superconducting dc electromagnets. All of these are intended to be within the scope of the present invention.

The NMR electronics 129 is housed in the NMR sensor assembly 113. The purpose of the NMR electronics 129 is to control the sensor assembly 113, record, process and transmit the recorded data, to the telemetry module 72. This can be done by means of electrical or acoustic telemetry by known devices and will not be discussed. A spring 130 having a cable conduit through the spring 130 allows power and data transmission via the guide sleeve 111 and slip ring through the cable conduit to and from the MWD tool 79. The MWD tool 79 also transmits data to the sensor assembly 113, for example, through mud pulse telemetry, and provides power from the power unit 78.

The sensor assembly 113 is also provided with at least one clamping pad, clamping piston or ribs 121. The ribs 121 are capable of outward movement for locking the sensor assembly 113 to the borehole wall during measurement by the sensor assembly 113. In one embodiment, the ribs 121 are hydraulically activated. In the inactivated position of the ribs 121, the sensor assembly 113 rests on the lower tool joint 139 and is held up against gravitational pull by the spring 130 that is fixedly attached to the drill pipe section 101. Continued rotation of the drillstring 20 loosely carries the sensor assembly 113 along. In the activated position, the ribs 121 engage the borehole walls and prevent any further movement of the sensor assembly 113. Further rotation of the drillstring 20 does not affect the position of the sensor assembly 113 that remains in a clamped position against the borehole wall. In the clamped position, the sensor assembly 113 is essentially decoupled from rotational and vertical movement of the drillstring 20, enabling measurements, such as NMR measurements from the NMR sensor assembly 113, to be carried out without interference from tool motion and vibration. By special design of the magnet assembly 115, the region of examination is within the formation and no NMR signal is received from the borehole fluid because no NMR resonance condition exists there.

In another embodiment, at least one sensor of the sensor assembly 113 is located in the at least one clamping pad (not shown) to provide a sensor at the borehole wall when the at least one clamping pad is activated and engaged with the borehole wall. In still another embodiment, at least one transmitter (not shown) is located in the at least one clamping pad to provide a transmitter at the borehole wall when the at least one clamping pad is activated and engaged with the borehole wall.

In typical operation, the NMR measurement takes between 0.01 to 1 second, during which time the drill pipe section 101 advances some distance. Once the NMR measurement has been completed, the ribs 121 are retracted, as a result of which the sensor assembly 113 is no longer coupled to the borehole wall. The sensor assembly 113 then drops down until any further downward motion is stopped by the spring 130. In another embodiment, the ribs 121 are actuated electrically, e.g., by a stepper motor. Other methods, such as those using springs, would be known to those versed in the art.

Figure 3A:
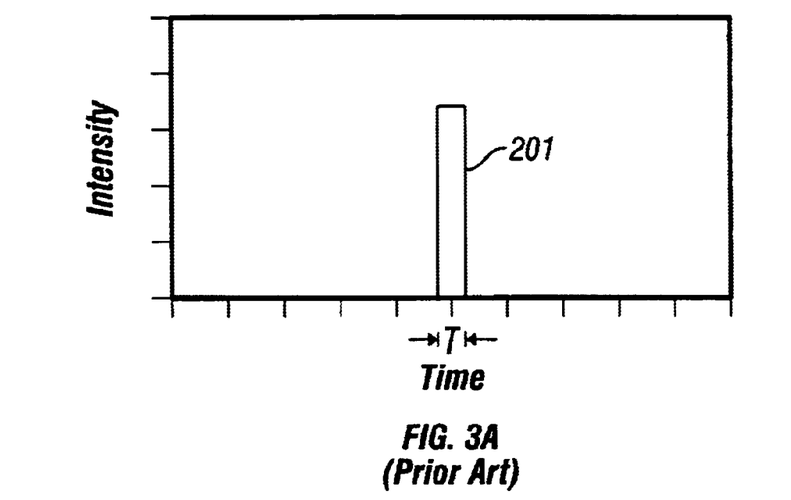
FIGS. 3A and 3B (PRIOR ART) are views in both the time domain and the frequency domain of the waveform used in prior art.
Figure 3B:
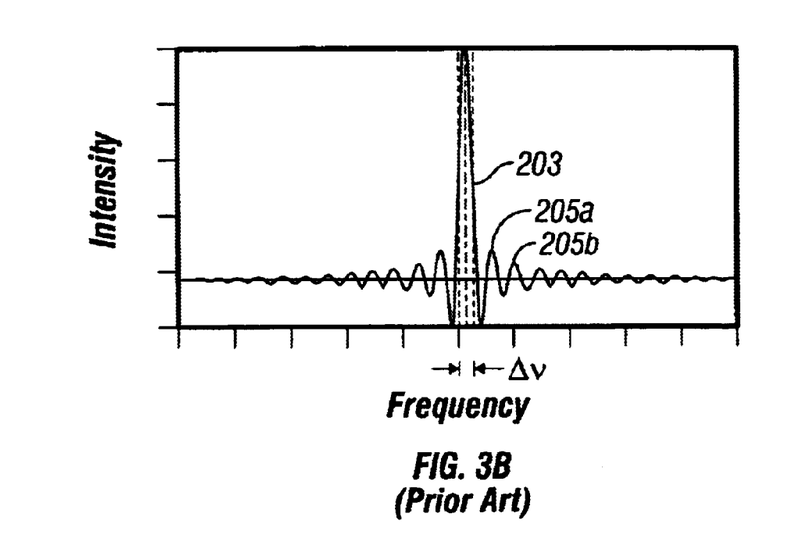

Referring to FIGS. 3A–3B (PRIOR ART), which show the known RF excitation pulse with rectangular envelope, from now on referred to as rectangular excitation pulse. The pulse appears in the time domain as the waveform 201 and has the frequency spectrum 203. The spectrum 203 contains numerous oscillations.

It can be shown that, for a rectangular pulse of duration T, half-height bandwidth $\Delta v$ and peak pulse power P, T equals $0.6/\Delta v$ and P is proportional to $1/T^2$, provided that the product $B_{rf}T$, and therefore the flip angle, remains constant. $B_{rf}$ is defined as the amplitude of the oscillating radio frequency field. Hence the known rectangular pulse has the drawback that peak power increases strongly (quadratically, in fact) as bandwidth increases.

It appears from an analysis of the rectangular pulse that the high power requirement is attributable to two main factors. Firstly, the sidelobes 205a, 205b apparent in the frequency domain consume substantial power without contributing to the useful part of the spectrum (the central peak). Secondly, the range of excitation frequencies contained in the pulse are in phase at time zero. Hence there is a high degree of constructive interference between the various frequencies at and very close to time-zero, but destructive interference at other times. Thus the pulse is of short duration and high peak power.

Smith et al (U.S. Pat. No. 5,814,987), having an inventor in common with the present application, teaches that in the case of NQR, a solution to the first of the problems (sidelobes) is to use a pulse which is shaped so as to yield a near-rectangular shaped frequency spectrum (that is, the modulus of the frequency domain excitation is substantially constant over the selected excitation frequency range). Shaping of the pulse is achieved by inverse Fourier transform of the near-rectangular frequency spectrum to yield the required shape of the time-domain excitation waveform.

The solution to the second of these problems (high coherency near time zero), it has now been found, is to use excitation in which the phase varies generally non-linearly with the frequency, so that the phases in the time domain are scrambled. Hence there is constructive interference between the various frequencies over a significantly longer duration than is the case for the simple rectangular pulse and at the same time less constructive interference at time zero. Thus the excitation pulse can be of longer duration and lower power. In fact, for a quadratic phase variation it has been found that at constant flip angle, the power P for such a pulse is more nearly proportional to $\Delta v$ as is the case for the rectangular excitation pulse. This conclusion follows from the relationship $B_{rf} \propto (\Delta v/t_p)^{1/2}$ where $t_p$ is the pulse length; $\Delta v$ and $t_p$ are now not dependent (they are for the simple rectangular pulse), so keeping $t_p$ constant we get $B_{rf} \propto (\Delta v)^{1/2}$ and $P \propto \Delta v$. Power has also been found to be inversely proportional to the duration of the pulse for a given excitation bandwidth $\Delta v$. The preferred embodiment of the present invention is based on the recognition that the method of Smith as applied to NQR is also applicable to downhole NMR.

The variation of phase with frequency should be non-linear in order to ensure a proper scrambling of the phases. A linear phase variation merely has the effect of producing a time-shift, but does not have the effect of scrambling phases.

With the technique of the preferred embodiment, each individual excitation pulse is shaped such that phase varies during the pulse, and preferably over a substantial proportion of the duration of the pulse, say, over at least 50%, more preferably at least 75 or 90%, most preferably over the entirety of the pulse. The phase modulation is preferably continuous in time, the excitation pulse itself being continuous in time (that is, there is no period during the pulse when the excitation is off, although the excitation may instantaneously pass through zero.)

As mentioned previously, the invention is based on the phase of the excitation varying generally non-linearly with excitation frequency. Thus the excitation can be represented as a complex function in the frequency domain (of the form $E(\omega)=E_{real}(\omega)+iE_{imaginary}(\omega)$). In general, the excitation will also be a complex function in the time domain (of the form $E(t)=E_{real}(t)+iE_{imaginary}(t)$).

In general the complex modulation is obtained and applied as follows.
1. Select the wanted shape (envelope) of excitation in the frequency domain.
2. Vary the phase quadratic with frequency. This creates a complex frequency spectrum.
3. Inverse Fourier transform the complex frequency spectrum into a complex modulation signal.
4. Store the two parts (I&Q) of the modulation signal (e.g. in digital form).
5. Apply the stored complex modulation signal to the I & Q inputs of a single-sideband mixer (FIG. 4).

The magnitude of this complex modulation signal will normally not have any zero crossings, i.e. the magnitude continually rises at the beginning of the RF pulse and falls at the end of the RF pulse. Complex modulation done in this way achieves the lowest RF power requirements.

Figure 4:
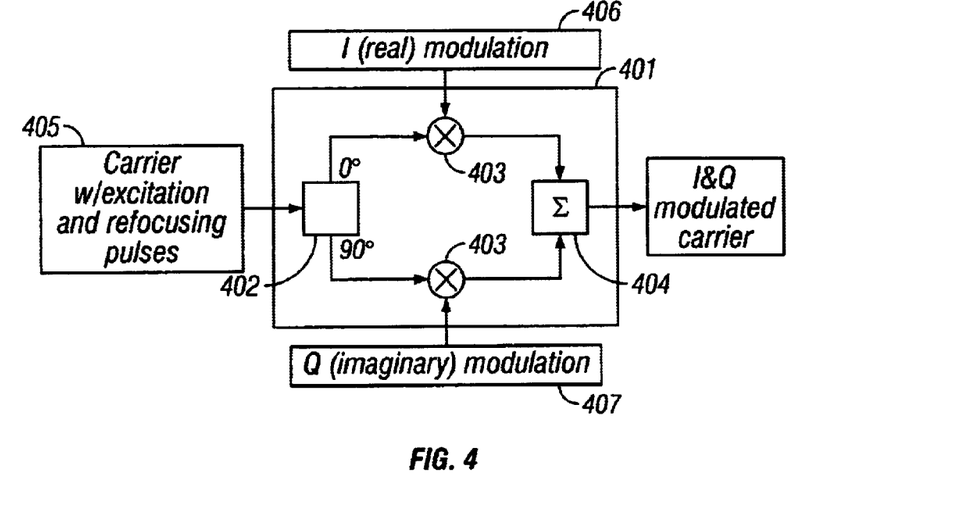
FIG. 4 shows a schematic drawing of a single sideband (SSB) mixer used in complex modulation.

FIG. 4 shows the schematic method for combining the carrier and modulation signal. The process can be carried out using a single-sideband (SSB) mixer 401. The SSB mixer consists of a 0°/90° splitter 402, multipliers (mixers) 403 and a power splitter 404 used for summing signals. The SSB receives the carrier signal with refocusing and excitation pulses 405 and splits the signal into its in-phase (real) and quadrature (imaginary) components. One of the multipliers 403 multiplies the in-phase component of the carrier signal with the in-phase component of the modulation signal 406, while the other multiplies the quadrature component of the carrier signal with the quadrature component of the modulation signal 407. The two mixed signals are then summed together at the power splitter 404.

Although the complex modulation, described above, is the most efficient for power saving, it is sometimes desirable to use a less sophisticated kind of RF pulse modulation to simplify the hardware and software of the apparatus. In particular there is the possibility of phase modulation without amplitude modulation. The phase modulation can, for example, be applied in the form of a frequency sweep or as stepped phase changes over the length of the pulse. The latter is known under the term of "composite pulse" by people familiar with the art of NMR, and is especially easy to apply.

A purely amplitude modulated time domain excitation waveform will in general not be adequate for the purpose of the present invention. However, there are special cases in which this can be used. Two such cases are now exemplified with reference to FIGS. 5a–5d and 6a–6d respectively. In both examples, the functions in the time domain had no fixed length, so that it was necessary to truncate them symmetrically at both ends where they tended to zero. The result of the truncation was to produce various artifacts in the frequency domain. These could be reduced (but not avoided) by using some form of apodisation if desired.

In the first example, (FIG. 5), a rectangular shape was selected for the frequency domain excitation spectrum. The phase variation over the selected excitation frequency range was quadratic with respect to the frequency off-set ($\Delta v = v - v_0$), and anti-symmetric about the center (carrier) frequency ($v_0$). That is, in the lower frequency half-range, the phase varied quadratically and was negative; at the center frequency, the phase was zero; and in the upper frequency half-range, the phase varied quadratically and was positive.

Figure 5A:
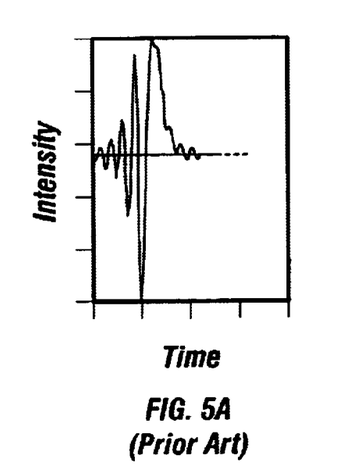
FIGS. 5A–5B show the real and imaginary parts of a phase and amplitude modulated pulse in the time domain, needed to excite a rectangular bandwidth in the frequency domain FIGS. 5C–5D.
Figure 5B:
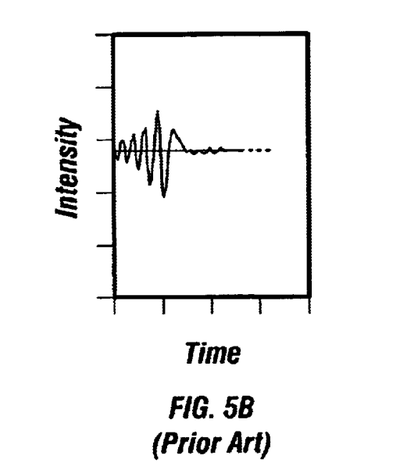

The time domain waveform obtained by inverse Fourier transformation of this spectrum is shown in FIG. 5a (the real part of the waveform) and FIG. 5b (the imaginary part). The waveform was truncated to a duration of 1 ms. Note that in this example the imaginary part should have been zero in theory, and only appears because the center of the spectrum was taken at point 512 of 1024 points instead of between 512 and 513.

It will be understood that in FIGS. 5a and 5b the radio-frequency carrier signal has been omitted for clarity. In fact, FIGS. 5a and 5b represent the modulating waveform (shaping function) which is mixed with the carrier signal. This convention is utilized from henceforth.

Figure 5C:
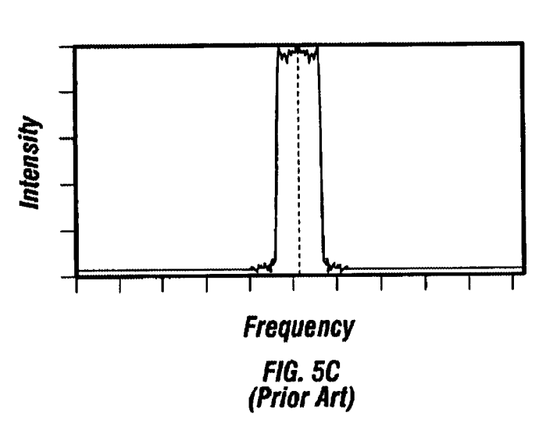

FIG. 5c shows the modulus of the Fourier transform of the waveform of FIGS. 5a and 5b. The deviation from a pure rectangular shape is caused by the truncation of the waveform.

Figure 5D:
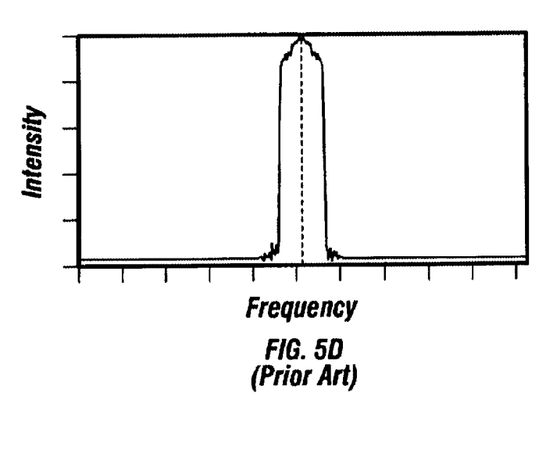

FIG. 5d is the same as FIG. 5c, except that the imaginary part of the time domain waveform (see FIG. 5b) was set to zero. It can be seen that FIG. 5d does not differ excessively from FIG. 5c. This is because the imaginary part of the waveform was in any case small. Hence it is acceptable to ignore the imaginary part of the waveform and utilize as the modulating waveform purely the real part shown in FIG. 5a.

Thus in this example, in practice only the waveform shown in FIG. 5a was utilized as the modulating waveform. This waveform amplitude modulates, but does not otherwise phase modulate, the carrier signal. It will of course be understood that even "pure" amplitude modulation (achieved, for example, by multiplication of two signals with each other) gives rise to a change of phase (between 0° and 180).

In the second example (FIG. 6), a rectangular shape, symmetric with respect to the carrier frequency, was selected for the frequency domain excitation spectrum, but only the upper half of the desired rectangular spectrum was selected. The phase variation over the selected excitation frequency range was quadratic. The example relies on the fact that if a carrier frequency $v_0$ is multiplied (mixed, amplitude modulated) with a linear modulating signal $v_m$ the resultant is a pair of frequencies symmetric about the original carrier, with the carrier itself gone: $v_{1,2}=v_0 \pm v_m$. Therefore if a complex waveform is derived which covers one half of the desired bandwidth on one side of the carrier frequency, and then only the real part of that waveform is taken, the complete bandwidth is covered. This is illustrated in FIG. 6.

Figure 6A:
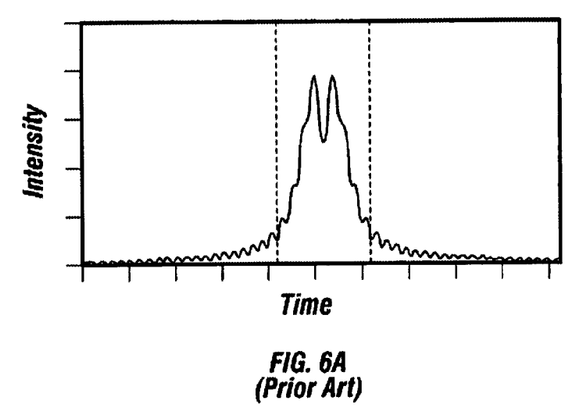
FIGS. 6A–6B show the envelope and the real part of the phase and amplitude modulated pulse in the time domain, which would be needed to excite half of the desired rectangular spectrum. By using only the real part (FIG. 6B) of the complex time domain waveform for modulation of the carrier the full desired bandwidth is excited (FIGS. 6C–6D).
Figure 6B:
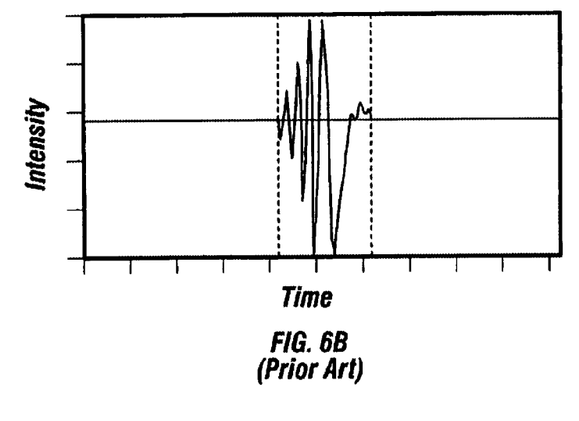
Figure 6C:
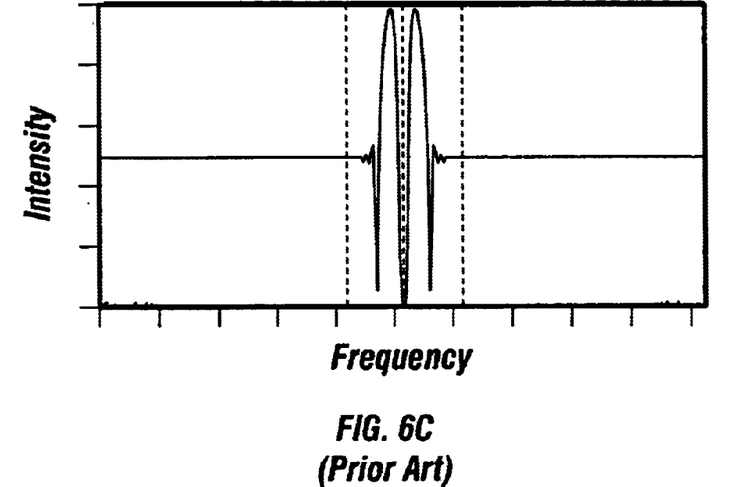
Figure 6D:
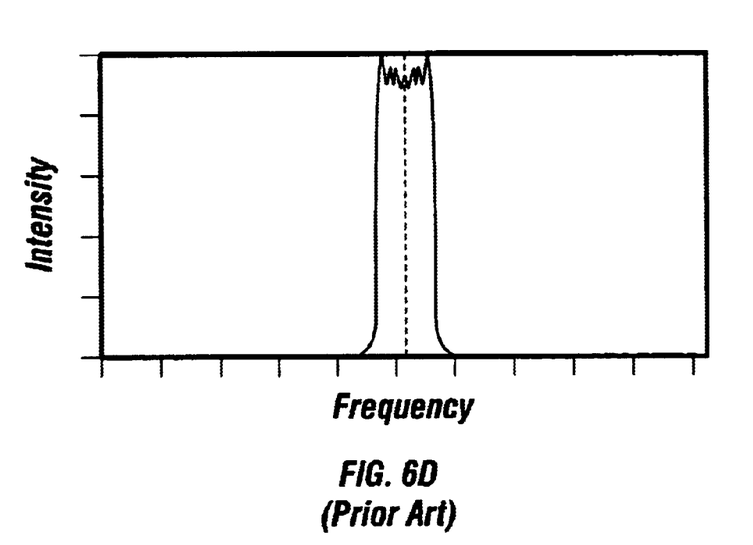

FIG. 6a shows the modulus of the time domain waveform obtained by inverse Fourier transformation of the upper half-bandwidth. The dotted lines indicate where the waveform was truncated to create a 1 ms pulse duration. FIG. 6b shows the truncated real part of this waveform. This real part is the modulating waveform which was used to modulate the carrier signal. FIG. 6c shows the real part of the Fourier transform of the truncated waveform of FIG. 6b, whilst FIG. 6d shows the modulus of this transformation. The deviation from a rectangular shape is again due only to the truncation. In FIG. 6d the carrier frequency is shown as a dotted line. It is clear from FIG. 6d that there is excitation of both sides of the carrier frequency.

In the latter two examples, where only a real modulation signal is used, there are many zero crossings, which in turn increases the RF power needed. The original complex modulation is better in this respect. On the other hand, only one real modulation waveform needs to be stored and applied (no SSB mixer needed) in the latter two examples.

As mentioned previously, the phases between the frequency components of the waveform are scrambled so as to achieve the desired pulse shape and to reduce the undesirable high peak of the pulse. Methods for scrambling the phase are non-linear in order to insure a proper scrambling of the phases. Scrambling the phases gives the initial RF signal the desired shape, but as a result the FID or spin echo signals will also be out of phase. Unscrambling the signal phases can be done via post-processing the signals with a suitable algorithm. One such method would be to use a FT/inverse FT pair and then to unscramble the phases in the frequency domain by applying the inverse phase function to the function which was applied to generate the complex modulation signal. Another method would unscramble the signal in the time domain by complex demodulation of the received signal with an appropriate demodulation signal.

This method described herein differs from pulse shaping methods of Smith et al. Smith's signal has a narrow bandwidth comprised more or less of a single frequency component. A simple zero-order phase correction is sufficient to correct this signal. For the signal formed from the invention described herein, all frequency components of the RF pulses will also be found in the NMR signal. Due to the many components with scrambled phases, it is necessary to unscramble them to see a NMR signal in the accustomed way so that it is easy to analyze this signal quantitatively. In addition, Smith deals with the NQR problem that does not use a static magnetic field.

The shape of the pulse is similar to that described in a paper entitled "Generation of optimal excitation pulses for two energy level systems using an inverse Fourier transform method" by Guan, S. (J. Chem. Phys., Vol. 96, No. 11, 1992, pp. 7959ff.), which is alluded to in U.S. Pat. No. 5,814,987 (Smith et al.). In the paper by Guan, the pulse has a non-contiguous frequency spectrum, and excitation pulses have frequencies that vary non-linearly. Specifically, whereas the pulse is used in studying the small concentration of interesting substance in a solvent, the spectrum of the pulse has a notch at the resonant frequency of the solvent. However, in the invention described herein, it is desired to produce a contiguous, rather than non-contiguous, set of frequencies within the frequency domain. In a preferred embodiment of the invention both excitation and refocusing pulses are modulated. In alternate embodiments of the invention, one or the other of the excitation pulse and the refocusing pulses are modulated.

The method of the present invention differs from that in Guan in that a contiguous frequency spectrum is generated whereas Guan deals with the problem of producing a notched spectrum. The method of present invention differs from that taught in Smith et al in that it is being applied to a two-level NMR system governed by the Bloch equation whereas Smith applies the pulse shaping method to a three level NQR system.

The method of the present invention may also be used with a logging apparatus that has a magnetic field gradient, such as that described in U.S. Pat. No. 5,712,566 to Taicher et al., the contents of which are fully incorporated herein by reference. The apparatus described therein includes a magnet for inducing a static magnetic field in the earth formations. The static magnetic field includes an amplitude gradient directed radially inwardly towards the longitudinal axis of the instrument. The apparatus disclosed in the Taicher '566 patent includes an antenna through which pulses of RF power are conducted to excite nuclei of the earth formations surrounding the instrument. The antenna includes a wire coil wound around a high magnetic permeability ferrite. The ferrite includes a frequency control coil wound thereon. By passing a selectively controllable DC voltage through the frequency control coil, the tuning frequency of the antenna can be selectively controlled, making transmission and reception of RF energy at different frequencies possible. Since the static magnetic field imparted by the magnet disclosed in the Taicher '566 patent includes an amplitude gradient, conducting NMR measurements at different frequencies will result in these different frequency NMR measurements taking place in different sensitive (excitation) volumes. When multi-frequency acquisition is carried out, the pulse shaping method of the present invention makes it possible to acquire data with a minimum of interference between adjacent frequencies. In contrast, prior art methods that use rectangular amplitude modulated pulses such as that shown in FIG. 3 could lead to interference between the sidelobes at a selected frequency and the main lobe at the adjoining frequency.

The foregoing description has been limited to specific embodiments of this invention. It will be apparent, however, that variations and modifications may be made to the disclosed embodiments, with the attainment of some or all of the advantages of the invention. In particular, the invention may be modified to make density and acoustic measurements. Therefore, it is the object of the appended claims to cover all such variations and modifications as come within the true spirit and scope of the invention.

What is claimed is:

1. A method for determining a parameter of interest of a volume of an earth formation surrounding a borehole with a logging tool conveyed in the borehole, the method comprising:
   (a) using a magnet assembly on the logging tool to produce a static magnetic field in said formation;
   (b) producing a radio frequency (RF) magnetic field in said volume of the formation with an antenna on the logging tool, said RF magnetic field having a direction substantially orthogonal to a direction of the static field, the RF field having a carrier frequency related to an intensity of the static field in said volume, said RF field modulated by a pulse sequence comprising an excitation pulse and a plurality of refocusing pulses; and
   (c) measuring with the logging tool spin echo signals induced by the RF field in the formation;
   wherein a phase of at least one of said plurality of refocusing pulses varies nonlinearly with frequency.

2. The method of claim 1 wherein for a duration of said at least one pulse an envelope of an associated time domain excitation waveform has no zero crossing.

3. The method of claim 1 wherein said at least one pulse is both phase and amplitude modulated.

4. The method of claim 1 wherein said at least one pulse is amplitude modulated but not otherwise phase modulated.

5. The method of claim 1 wherein the phase of the at least one pulse is one of (A) symmetric with frequency, and, (B) antisymmetric with frequency.

6. The method of claim 1 wherein the phase of said at least one pulse varies quadratically with frequency.

7. The method of claim 1 further comprises using a single side band (SSB) mixer for obtaining said phase.

8. The method of claim 1 further comprising unscrambling the phase of the spin echo signals.

9. A method for determining a parameter of interest of an earth formation surrounding a borehole with a logging tool conveyed in the borehole, the method comprising:

(a) using a magnet assembly on the logging tool to produce a static magnetic field in said formation;

(b) producing a first and a second radio frequency (RF) magnetic field in a first and second volume of the formation respectively with an antenna on thy logging tool, each of said RE magnetic fields having a direction substantially orthogonal to a direction of the static field, the RF field having a first and a second carrier frequency related to an intensity of the static field in said first and second volumes, each of said RF fields modulated by a pulse sequence comprising an excitation pulse and a plurality of refocusing pulses (c) measuring with the logging tool spin echo signals induced by the RE fields in the formation;

wherein a phase of at least one of said plurality of refocusing pulses for each of said RF fields varies nonlinearly with frequency.

10. The method of claim 9 wherein for a duration of said at least one pulse an envelope of an associated time domain excitation waveform has no zero crossings.

11. The method of claim 9 wherein said at least one pulse is both phase and amplitude modulated.

12. The method of claim 9 wherein said at least one pulse is amplitude modulated but not otherwise phase modulated.

13. The method of claim 9 wherein the phase of the at least one pulse is one of (A) symmetric with frequency, and, (B) antisymmetric with frequency.

14. The method of claim 9 wherein the phase of said at least one pulse varies quadratically with frequency.

15. The method of claim 9 further comprises using a single side band (SSB) mixer for obtaining said phase.

16. The method of claim 9 further comprising unscrambling the phase of the spin echo signals.

17. A method for determining a parameter of interest of a volume of earth formation surrounding a borehole with a logging tool conveyed in the borehole, the method comprising:

(a) using a magnet assembly on the logging tool to produce a static magnetic field in said volume of the formation;

(b) producing a radio frequency (RF) magnetic field in said volume of the formation with an antenna on the logging tool, said RE magnetic field having a direction substantially orthogonal to a direction of the static field, the RF field having a carrier frequency related to an intensity of the static field in said volume, (c) using a single side band mixer for modulating said RF field by a pulse sequence comprising an excitation pulse and a plurality of refocusing pulses and wherein a phase of at least one of said plurality of refocusing pulses varies nonlinearly with frequency; and (d) measuring with the logging tool spin echo signals induced by the RF field in the formation.

* * * * *